(12) United States Patent
Zhang et al.

(10) Patent No.: US 11,107,695 B2
(45) Date of Patent: Aug. 31, 2021

(54) SURFACE SMOOTHING OF WORKPIECES

(71) Applicants: Beijing E-Town Semiconductor Technology, Co., LTD, Beijing (CN); Mattson Technology, Inc., Fremont, CA (US)

(72) Inventors: Qi Zhang, San Jose, CA (US); Xinliang Lu, Fremont, CA (US); Hua Chung, Saratoga, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

(21) Appl. No.: 16/718,356

(22) Filed: Dec. 18, 2019

(65) Prior Publication Data
US 2020/0203173 A1   Jun. 25, 2020

Related U.S. Application Data

(60) Provisional application No. 62/783,517, filed on Dec. 21, 2018, provisional application No. 62/832,055, filed on Apr. 10, 2019.

(51) Int. Cl.
*H01L 21/3065* (2006.01)
*H01L 21/311* (2006.01)
(Continued)

(52) U.S. Cl.
CPC ...... *H01L 21/31116* (2013.01); *C23C 16/325* (2013.01); *C23C 16/56* (2013.01); *H01J 37/321* (2013.01); *H01J 37/3244* (2013.01); *H01J 37/32458* (2013.01); *H01L 21/0206* (2013.01); *H01L 21/02126* (2013.01); *H01L 21/02236* (2013.01); *H01L 21/02252* (2013.01);
(Continued)

(58) Field of Classification Search
CPC ............ H01L 21/02024; H01L 21/304; H01L 21/30604
See application file for complete search history.

(56) References Cited

U.S. PATENT DOCUMENTS

| 8,367,554 | B2 | 2/2013 | Han et al. |
| 8,945,414 | B1 | 2/2015 | Su et al. |

(Continued)

OTHER PUBLICATIONS

PCT International Search Report and Written Opinion for corresponding PCT Application No. PCT/US2019/067039, dated Apr. 23, 2020, 12 pages.

*Primary Examiner* — Thomas T Pham
(74) *Attorney, Agent, or Firm* — Dority & Manning, P. A.

(57) ABSTRACT

Apparatus, systems, and methods for processing workpieces are provided. In one example implementation, a fluorine and oxygen plasma-based process can be used to smooth a roughened surface of a silicon and/or a silicon containing structure. The process can include generating species from a process gas using an inductive coupling element in a first chamber. The process can include introducing a fluorine containing gas and an oxygen containing gas with the species to create a mixture. The process can further include exposing the silicon and/or the silicon containing structure to the mixture such that the mixture at least partially etches a roughened portion to leave a smoother surface of the silicon and/or the silicon containing structure.

11 Claims, 10 Drawing Sheets

(51) Int. Cl.
    *H01L 21/02*     (2006.01)
    *H01J 37/32*     (2006.01)
    *C23C 16/32*     (2006.01)
    *C23C 16/56*     (2006.01)
    *H01L 29/66*     (2006.01)

(52) U.S. Cl.
    CPC . *H01J 2237/332* (2013.01); *H01J 2237/3341* (2013.01); *H01L 29/66795* (2013.01)

(56) References Cited

U.S. PATENT DOCUMENTS

| | | | |
|---|---|---|---|
| 9,159,574 B2 * | 10/2015 | Yu | H01L 21/76898 |
| 10,269,574 B1 | 4/2019 | Yang et al. | |
| 10,354,883 B2 | 7/2019 | Yang et al. | |
| 10,403,492 B1 | 9/2019 | Li et al. | |
| 2004/0219789 A1 | 11/2004 | Wood et al. | |
| 2008/0057724 A1 | 3/2008 | Kiehlbauch et al. | |
| 2010/0244247 A1 * | 9/2010 | Chang | H01L 21/76898 |
| | | | 257/741 |
| 2014/0248780 A1 * | 9/2014 | Ingle | H01L 21/3065 |
| | | | 438/745 |
| 2016/0260616 A1 | 9/2016 | Li et al. | |
| 2018/0358204 A1 | 12/2018 | Ma et al. | |
| 2018/0358206 A1 | 12/2018 | Ma et al. | |
| 2018/0358208 A1 | 12/2018 | Ma et al. | |
| 2018/0358210 A1 | 12/2018 | Ma et al. | |
| 2019/0103270 A1 | 4/2019 | Yang et al. | |
| 2019/0211446 A1 * | 7/2019 | Ivanov | C23C 16/52 |

* cited by examiner

SURFACE SMOOTHING OF WORKPIECES

PRIORITY CLAIM

The present application claims the benefit of priority of U.S. Provisional Application Ser. No. 62/783,517 titled "Surface Smoothing of Workpieces," filed on Dec. 21, 2018, which is incorporated herein by reference. The present application claims the benefit of priority of U.S. Provisional Application Ser. No. 62/832,055, titled "Surface Smoothing of Workpieces," filed on Apr. 10, 2019, which is incorporated herein by reference.

FIELD

The present disclosure relates generally to semiconductor processing and more particularly, surface treatment processes for smoothing a surface of a workpiece.

BACKGROUND

The processing of semiconductor workpieces can involve the deposition and removal of different materials layers on a substrate. Device dimension and materials thickness continue to decrease in semiconductor processing with shrinking critical dimensions in semiconductor devices. In advanced device nodes, materials surface properties, such as roughness, and interface integrity become increasingly critical to device performance

SUMMARY

Aspects and advantages of the invention will be set forth in part in the following description, or may be obvious from the description, or may be learned through practice of the invention.

One example aspect of the present disclosure is directed to a method for processing a workpiece. The workpiece can include a silicon containing layer. A surface of the silicon containing layer can include a roughened portion. The method can include generating species from a process gas using an inductive coupling element in a first chamber; providing a fluorine-containing gas and an oxygen-containing gas into the species to generate a mixture; and exposing the surface of the silicon containing layer to the mixture such that the mixture at least partially etches the roughened portion to leave a smoother surface of the silicon containing layer.

Variations and modifications can be made to example embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
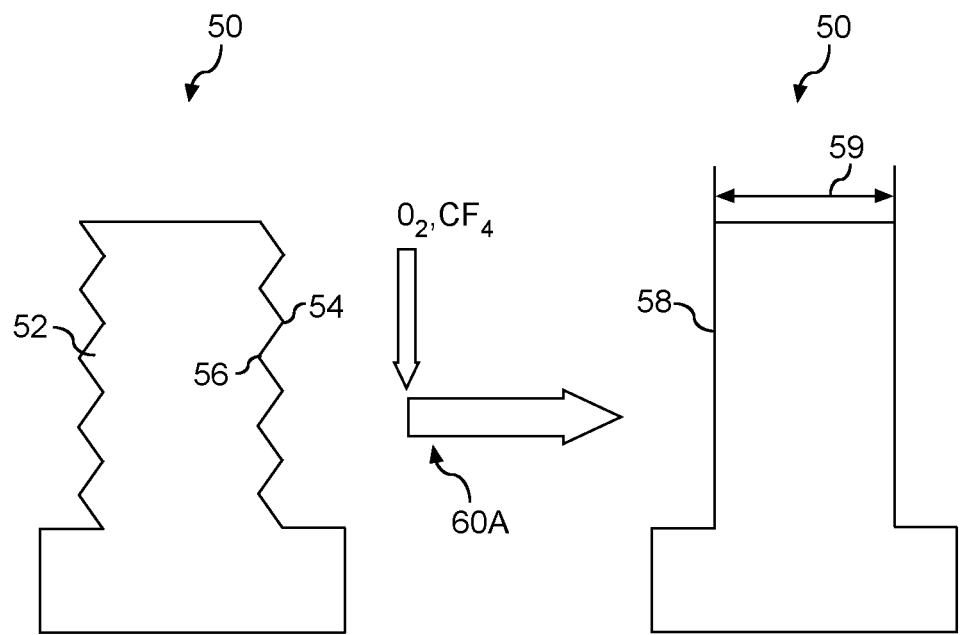
FIG. 1 depicts an example surface smoothing process on a structure according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for processing a workpiece to at least partially remove a roughened surface on the workpiece to leave a smoother surface. Silicon and/or silicon containing structures can sometimes suffer from increased surface roughness after etching. For instance, various processes, such as fluorine-containing and/or oxygen-containing chemistry can be used for etching silicon or silicon containing materials (e.g., SiGe). However, some etch processes can leave significant roughness on the materials surface which can impact interface properties and device performance.

According to example aspects of the present disclosure, a fluorine and oxygen plasma-based process can be used to smooth the roughened surface of the silicon and/or silicon containing structure. More particularly, a fluorine and oxygen plasma-based process can be used to detail a soft trim by oxidizing and etching the surface layer simultaneously to improve surface roughness.

In some embodiments, the process can include dissociating an inert gas (e.g., He, Ar, Xe, Ne, etc.) in a plasma chamber (e.g., using an inductively coupled plasma source). The process can include mixing the inert gas with a fluorine-containing gas and an oxygen-containing gas to form fluorine radicals and oxygen radicals. The fluorine radicals and the oxygen radicals can be exposed to the workpiece for smoothing of a silicon and/or silicon-containing structure or other surface in the workpiece.

In some embodiments, the fluorine radicals and/or the oxygen radicals can be generated in the plasma chamber that is separated from a processing chamber by a separation grid. The workpiece can be located in the processing chamber. The radicals generated in the plasma chamber can pass through the separation grid (e.g., as neutral species) for exposure to the workpiece in the processing chamber.

The fluorine radicals and the oxygen radicals can by generated by inducing a plasma from a process gas in the plasma chamber using an inductively coupled plasma source. The process gas can be a mixture comprising a fluorine containing gas, an oxygen containing gas, and/or a carrier gas. The fluorine containing gas can be, for instance, tetrafluoromethane ($CF_4$), nitrogen trifluoride ($NF_3$), or a gas with a formula $CF_xH_y$ (e.g., x and y are positive integers), etc. The oxygen containing gas can be, for instance, oxygen ($O_2$), water vapor ($H_2O$), or nitrous oxide ($N_2O$), etc. The carrier gas (also referred to as an insert gas) can be, for instance, helium (He), argon (Ar), xenon (Xe), neon (Ne), nitrogen ($N_2$), etc.

In some embodiments, the fluorine radicals and/or oxygen radicals can be generated by injecting fluorine containing gas and/or oxygen containing gas with species excited by a plasma source (e.g., excited inert gas species) at a downstream location of the plasma chamber. For instance, the fluorine containing gas and/or the oxygen containing gas can be injected at or below the separation grid using post plasma gas injection.

One example application of the process according to example embodiments of the present disclosure can be performed during direct etching of silicon and/or silicon containing structures. For instance, an etching process can be implemented using fluorine-containing, oxygen-containing, and inert gas. The process can leave a smoother surface with an oxidation layer on top of the surface. The oxidation layer can be removed, for instance, by a wet process, e.g., hydrofluoric acid (HF) dip, or removed by a dry etch process (e.g., plasma based process).

Another example application can be for surface treatment of a roughened silicon or silicon containing surface, such as crystalline silicon, polysilicon, or silicon germanium. The roughened surface can be induced by a previous etch process or deposition process (e.g., wet etch process or a dry etch process). The roughed surface can be treated using a remote plasma (e.g., plasma generated in a remote plasma source separated from a processing chamber by a separation grid). The plasma can be based on fluorine-containing and/or oxygen-containing gases. The process can mitigate surface roughness with some material loss.

In some embodiments, the materials losses and the smoothing effect using the process(es) according to example embodiments of the present disclosure can be balanced. For instance, material losses can be increased to provide a smoother surface. Less material losses can result in less smoothing effect. As one example, silicon surface roughness can be reduced by 30% with less silicon loss relative to achieving a pristine silicon surface with more material loss.

In some embodiments, the method can include generating fluorine (F), oxygen (O), carbon (C) or nitrogen (N) radicals with some bonds among those species. During reaction of the roughed surface with those species, there can also be a surface layer formed with composition (e.g., represented by the formula $SiO_xF_yC_z$, where x, y, z are positive integers). On the rough surface, a concave area may have a thicker formed surface layer while the convex area has a thinner formed surface layer. With some process time, the concave area can be etched more relative to the convex area, making the surface smoother. The formed surface layer can be easily removed by a wet process like diluted HF dip and/or removed by a dry etch process. It can also possible to leave at the surface for the next step if the process flow allows.

The above process is an etching process, which removes Si (amorphous Si, poly Si, crystalline Si or SiGe), as well as a deposition process, which forms $SiO_xF_yC_z$ layers. The layer thickness can be closely related to etch amount, so the roughness improvement comes with a loss of Si materials.

Adjusting the process condition such as the flow ratio of the fluorine containing gas, the flow ratio of the oxygen containing gas, plasma power, process pressure, and/or process temperature can adjust the ratio between the amount of material loss and surface smoothness improvement. As a result, the surface smoothing effect can be enhanced by adjusting those process parameters.

In some embodiments, the surface smoothing is done on a vertical structure, rather than on a planer surface. For instance, the surface smoothing can be implemented on a Si or SiGe Fin structure for FINFET devices. Smoothing efficiency (and hence also the material loss) on some 3D structures need to be same at top and bottom. These can also be enhanced by adjusting the process conditions.

For some applications, the formed surface layer needs to remain on the surface with high quality. One measure of quality can be the etch rate vs an etch rate for thermal oxide. To improve the quality, process parameters such as flow ratio of the fluorine containing gas, the flow ratio of the oxygen containing gas, plasma power, process pressure, and/or process temperature can be tuned.

Example process parameters for one example implementation according to example embodiments of the present disclosure are provided below:

Workpiece Temperature: about 100° C. to about 600° C., such as about 150° C. to about 300° C.;

Pressure: about 100 mTorr to about 4 Torr; such as about 400 mTorr to about 800 mTorr;

$CF_4$ Percentage in $O_2$: about 0.1% to about 5%, such as 0.1% to about 1%;

Plasma Source Power: about 100 W to about 3000 W, such as about 400 W to about 1000 W.

One example aspect of the present disclosure is directed to a method for processing a workpiece. The workpiece can include a silicon containing layer (e.g., crystalline silicon, polysilicon, silicon germanium, or Fin structure for FINFET devices). A surface of the silicon containing layer can include one or more roughened portions. The method can include generating species from a process gas using an inductive coupling element in a first chamber, introducing a fluorine containing gas (e.g., tetrafluoromethane ($CF_4$), nitrogen trifluoride ($NF_3$), or a gas with a formula $CF_xH_y$, wherein x and y are positive integers) and an oxygen containing gas (e.g., oxygen ($O_2$), water vapor ($H_2O$), or nitrous oxide ($NO_2$)) with the species to create a mixture (e.g., including fluorine radicals and oxygen radicals), exposing the surface of the silicon containing layer to the mixture such that the mixture etches the roughened portion to leave a smoother surface of the silicon containing layer.

In some embodiments, the roughened portion can include a concave area and a convex area. The concave area can be thicker than the convex area. As used herein, a roughened portion refers to a surface having concave and convex areas, even at a nanometer scale level. There is no requirement that the surface be intentionally roughened for a surface to be considered a roughened surface.

The mixture can etch the concave area more than the convex area to leave the smoother surface of the silicon containing layer. As used herein, a smoother surface results from or is left from a process (e.g., exposure to a mixture) when a surface roughness of the surface is reduced relative to prior implementation of the process.

In some embodiments, a concentration of the fluorine containing gas in the oxygen containing gas is in the range of about 0.1% to about 5%. In some embodiments, the process gas can include an inert gas (also referred to a carrier gas), e.g., helium (He), argon (Ar), xenon (Xe), neon (Ne), nitrogen ($N_2$). In some embodiments, at least one of the fluorine containing gas and the oxygen containing gas can be part of the process gas. For instance, the workpiece can be in a second chamber that is separated from the first chamber by a separation grid. At least one of the fluorine containing gas and the oxygen containing gas can be introduced via a post-plasma gas injection source located at or below the separation grid. The at least one of the fluorine containing gas and the oxygen containing gas can be mixed with the species to create a filtered mixture for exposure to the workpiece.

In some embodiments, the mixture can oxidize and etch the roughened portion simultaneously to leave the smoother surface. In some embodiments, an oxidation layer can be formed on the smoother surface of the silicon containing layer. The method can further include a wet process (e.g., HF dip process) or a dry etch process to remove the oxidation layer. In some embodiments, the method can further include a deposition process such that a formed surface layer with a formula $SiO_xF_yC_z$ where x, y and z are positive integers remains on the workpiece. In some embodiments, the formed surface layer can be removed by a wet process or by a dry chemical etch process.

One example aspect of the present disclosure is directed to a plasma processing apparatus for processing a workpiece. The plasma processing apparatus can include a processing chamber having a workpiece support. The workpiece support can support the workpiece during plasma processing. The workpiece can include a silicon containing layer. A surface of the silicon containing layer can include one or more roughened portions. The plasma processing apparatus can further include a plasma chamber separated from the processing chamber by a separation grid. The plasma processing apparatus can include an inductive coupling element to induce a plasma in a process gas in the plasma chamber. The plasma processing apparatus can include a first gas source injecting a fluorine containing gas, and a second gas source injecting an oxygen containing gas. A mixture generated by mixing the fluorine containing gas and the oxygen containing gas with species generated in the plasma can pass through the separation grid to etch the one or more roughened portions to leave a smoother surface of the silicon containing layer.

Example aspects of the present disclosure provide a number of technical effects and benefits. For instance, a fluorine and oxygen containing plasma (e.g., an inductively coupled plasma source) can etch one or more roughened portions of a silicon containing structure layer (e.g., Fin structure for FINFET devices) to leave a smoother surface of the silicon containing structure with reduced silicon material loss. As such, a surface roughness of the silicon containing structure can be improved such that interface properties and device performance can be improved.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

FIG. 1 depicts an example surface smoothing process on a structure 50 according to example embodiments of the present disclosure. The structure 50 is a silicon containing structure (e.g., a FIN structure, crystalline silicon, polysilicon, or silicon germanium) with a roughened surface 52. The roughened surface 52 can include a convex area 54 and a concave area 56.

An etching process 60A according to example aspects of the present disclosure can be conducted on the structure 50 to remove one or more portions of the roughened surface 52. Fluorine containing gas (e.g., tetrafluoromethane ($CF_4$), nitrogen trifluoride ($NF_3$), or a gas with a formula $CF_xH_y$, wherein x and y are positive integers) and oxygen containing gas (e.g., oxygen ($O_2$), water vapor ($H_2O$), or nitrous oxide ($NO_2$)) are introduced into the etching process 60A. For instance, the fluorine containing gas and oxygen containing gas can be part of a process gas. As another example, at least one of the fluorine containing gas and the oxygen containing gas can be introduced via a post-plasma gas injection source. The etching process 60A removes the roughened surface 52 and leaves a smoother surface 58. As such, a surface roughness can be improved while keeping critical dimension 59 loss small.

In some embodiments (not shown in FIG. 1), the concave area 56 can be thicker than the convex area 54. The etching process 60A can etch the concave area 55 more than the convex area 54 to leave the smoother surface 58 of the structure 50.

Figure 2:
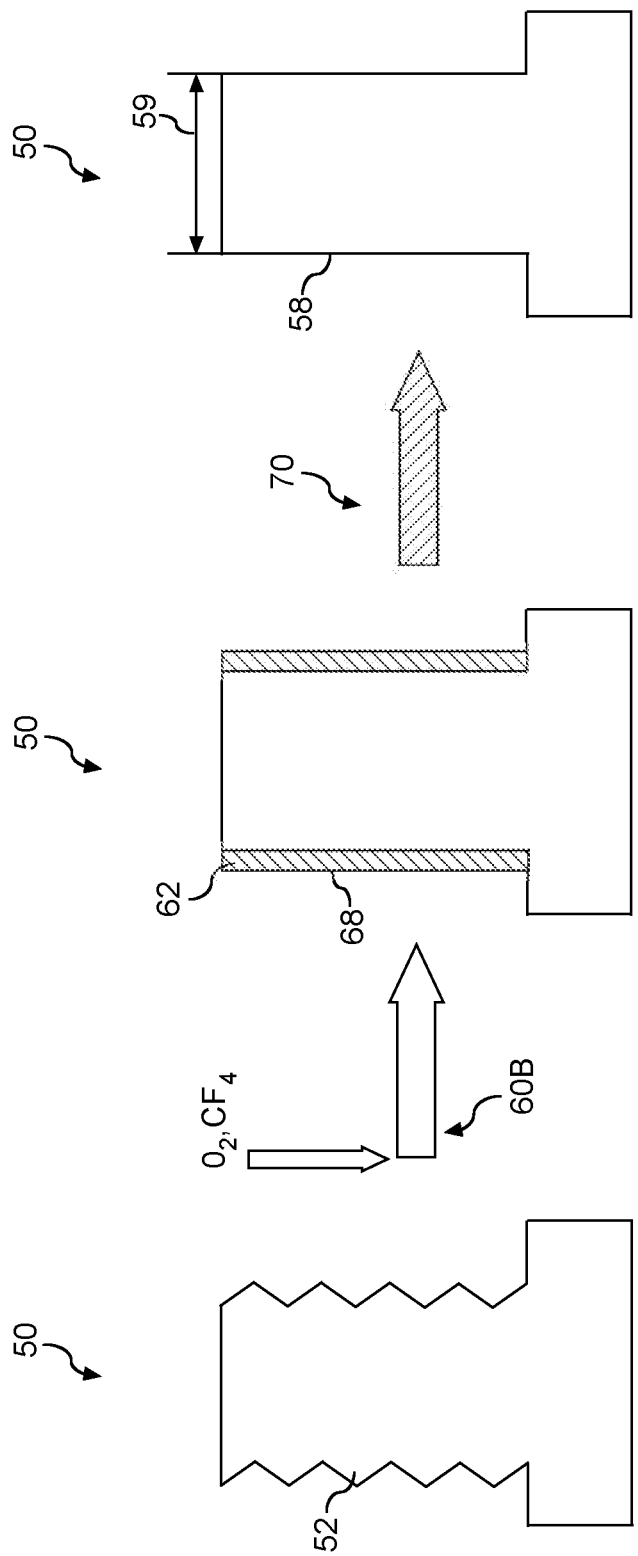
FIG. 2 depicts an example surface smoothing process on a structure according to example embodiments of the present disclosure.

FIG. 2 depicts an example surface smoothing process on a structure 50 according to example embodiments of the present disclosure. The structure 50 is a silicon containing structure with a roughened surface 52.

An oxidation and etching process 60B according to example aspects of the present disclosure can be conducted on the structure 50 to remove one or more portions of the roughened surface 52. Fluorine containing gas (e.g., tetrafluoromethane ($CF_4$), nitrogen trifluoride ($NF_3$), or a gas with a formula $CF_xH_y$, wherein x and y are positive integers) and oxygen containing gas (e.g., oxygen ($O_2$), water vapor ($H_2O$), or nitrous oxide ($NO_2$)) are introduced into the oxidation and etching process 60B. For instance, the fluorine containing gas and oxygen containing gas can be part of a process gas. As another example, at least one of the fluorine containing gas and the oxygen containing gas can be introduced via a post-plasma gas injection source. The oxidation and etching process 60B oxidizes and etches the roughened surface 52 simultaneously to leave a smoother surface 58 with an oxidation layer topmost. Subsequent to the oxidation and etching process 60B, a wet process or a dry etch process 70 is conducted on the structure 50 to remove the oxidation layer 62. As such, a surface roughness can be improved while keeping critical dimension 59 loss small.

Figure 3:
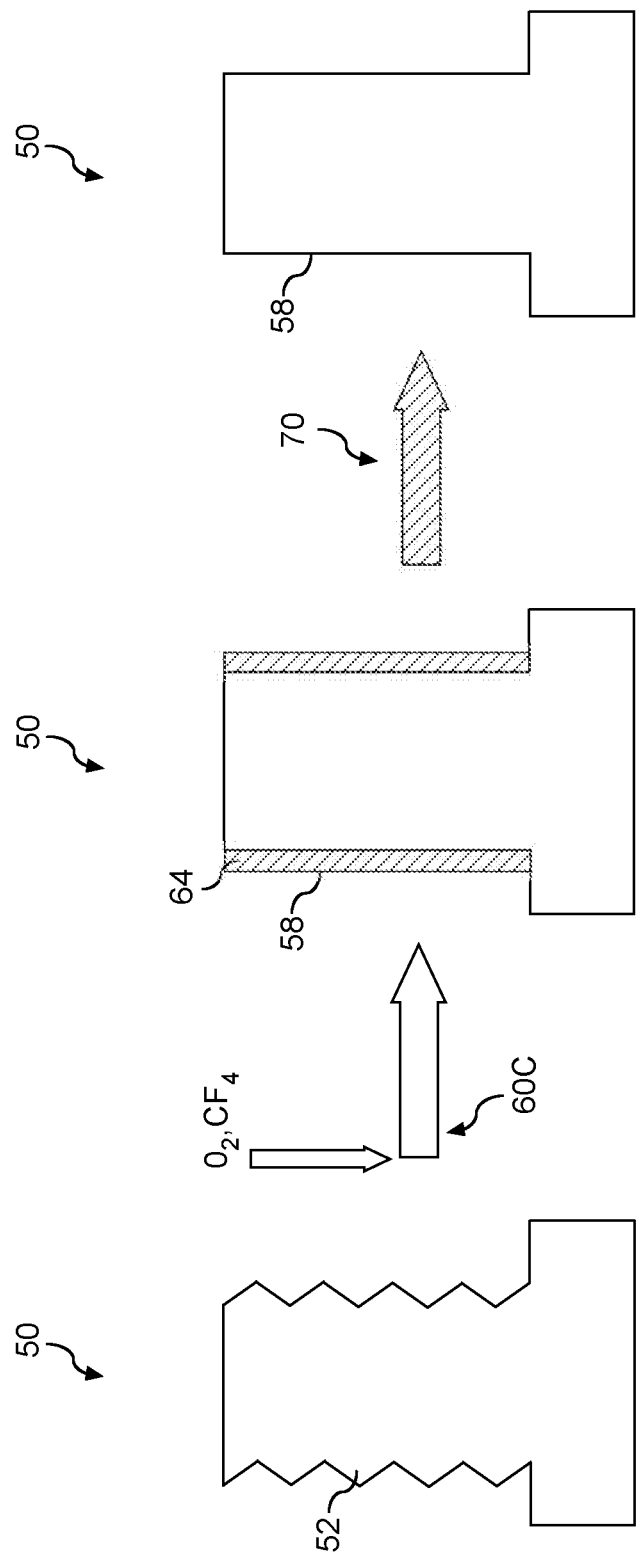
FIG. 3 depicts an example surface smoothing process on a structure according to example embodiments of the present disclosure.

FIG. 3 depicts an example surface smoothing process on a structure 50 according to example embodiments of the present disclosure. The structure 50 is a silicon containing structure with a roughened surface 52.

An etching and deposition process 60C according to example aspects of the present disclosure can be conducted on the structure 50 to remove one or more portions of the roughened surface 52. Fluorine containing gas (e.g., tetrafluoromethane ($CF_4$), nitrogen trifluoride ($NF_3$), or a gas with a formula $CF_xH_y$, wherein x and y are positive integers) and oxygen containing gas (e.g., oxygen ($O_2$), water vapor ($H_2O$), or nitrous oxide ($NO_2$)) are introduced into the etching and deposition process 60C. For instance, the fluorine containing gas and oxygen containing gas can be part of a process gas. As another example, at least one of the fluorine containing gas and the oxygen containing gas can be introduced via a post-plasma gas injection source. The etching and deposition process 60C etches the roughened surface 52 and deposits a surface layer 64 with a formula $SiO_xF_yC_z$ where x, y and z are positive integers to leave a smoother surface 58. Subsequent to the etching and deposition process 60C, a wet process or a dry etch process 70 is conducted on the structure 50 to remove the surface layer 64. As such, a surface roughness can be improved while keeping critical dimension loss small.

Figure 4:
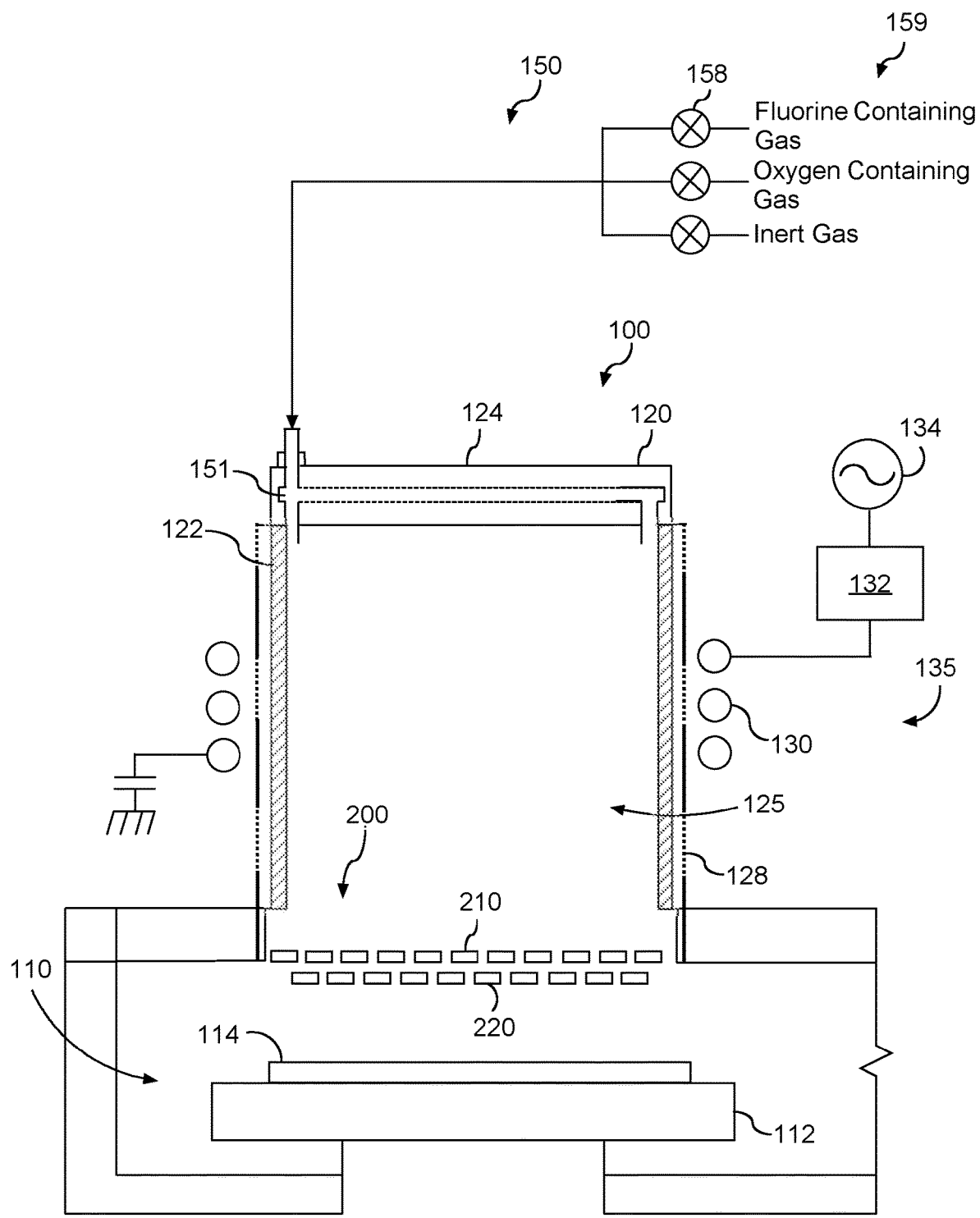
FIG. 4 depicts an example plasma processing apparatus according to example embodiments of the present disclosure.

FIG. 4 depicts an example plasma processing apparatus according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to support a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., a fluorine containing gas, an oxygen containing gas, and a carrier gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 4, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 4, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 4, the gas delivery system 150 can include feed gas line(s) for delivery of a fluorine containing gas (e.g., tetrafluoromethane ($CF_4$), nitrogen trifluoride ($NF_3$), or a gas with a formula $CF_xH_y$, wherein x and y are positive integers), feed gas line(s) for delivery of an oxygen containing gas (e.g., oxygen ($O_2$), water vapor ($H_2O$), or nitrous oxide ($NO_2$)), and feed gas line(s) for delivery of an inert gas (e.g., helium (He), argon (Ar), xenon (Xe), neon (Ne), or nitrogen ($N_2$)). A control valve and/or mass flow controller 158 can be used to control a flow rate of each feed gas line to flow a process gas into the plasma chamber 120.

Figure 5:
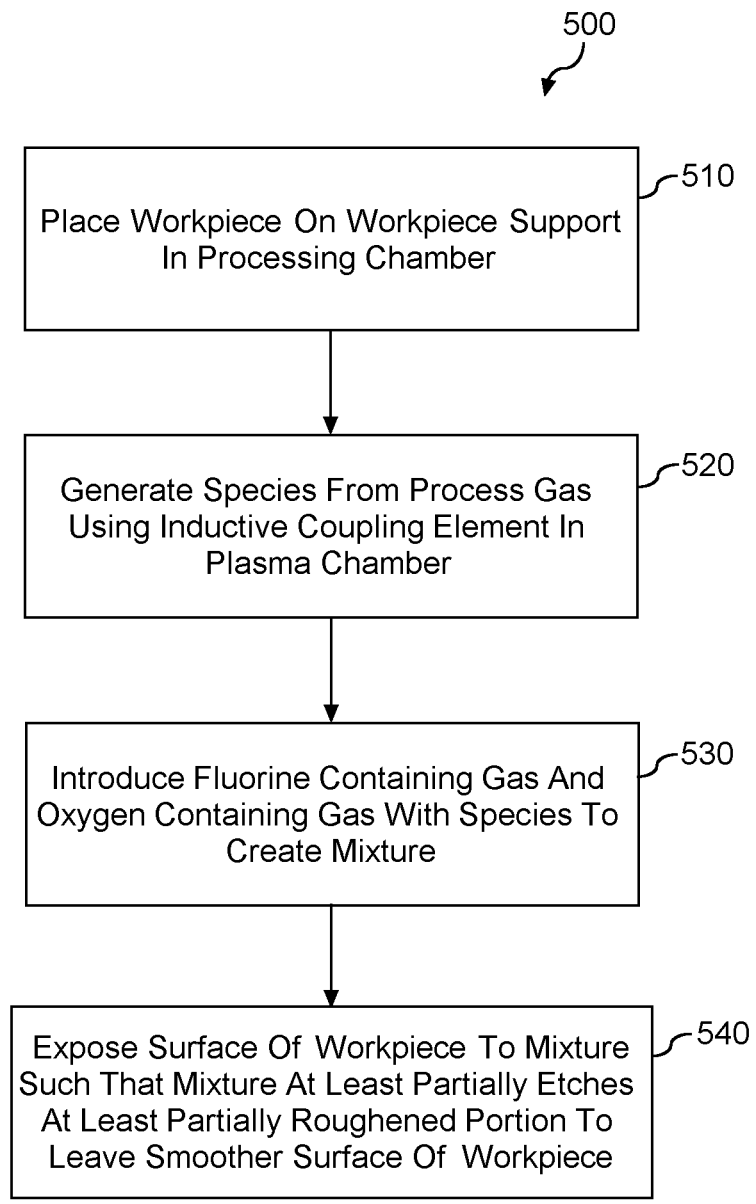
FIG. 5 depicts a flow diagram of an example method according to example embodiments of the present disclosure.

FIG. 5 depicts a flow diagram of an example method (500) according to example embodiments of the present disclosure. The method (500) will be discussed with reference to the plasma processing apparatus 100 of FIG. 4 by way of example. The method (500) can be implemented in any suitable plasma processing apparatus. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (510), the method can include placing a workpiece on a workpiece support in a processing chamber. For instance, a workpiece 114 can be placed on a workpiece support 112 in a processing chamber 110. The workpiece 114 can include a silicon containing layer having one or more roughened portions. For instance, a FIN structure 50 includes a roughened surface 52.

At (520), the method can include generating species from a process gas using an inductive coupling element in a second chamber. For instance, a gas delivery system 150 of a plasma processing apparatus 100 can use the feed gas lines 159 to deliver a process gas into a plasma chamber 120 to generate the species.

At (530), the method can include introducing a fluorine containing gas and an oxygen containing gas with the species to create a mixture. In some embodiments, fluorine containing gas and/or an oxygen containing gas can be introduced as part of the process gas. For instance, the gas delivery system 150 can use the feed gas lines 159 to deliver the fluorine containing gas and the oxygen containing gas into the plasma chamber 120 to create a mixture (e.g., radicals). In some embodiments, the fluorine containing gas and/or the oxygen containing gas can be introduced via a post-plasma gas injection, as further described in FIGS. 6 and 7.

In some embodiments, a concentration of the fluorine containing gas relative to the oxygen containing gas is in the range of about 0.1% to about 5%. For instance, a concentration of $CF_4$ relative to $O_2$ is in a range of about 0.1% to about 5%, such as in a range of about 0.1% to about 1%.

At (540), the method can include exposing the surface of the workpiece to the mixture such that the mixture at least partially etches at least partially roughened portion to leave a smoother surface of the workpiece. For instance, the workpiece 114 can be exposed to the species generated in the inductively coupled plasma to remove one or more roughened portions of the workpiece 114.

Figure 6:
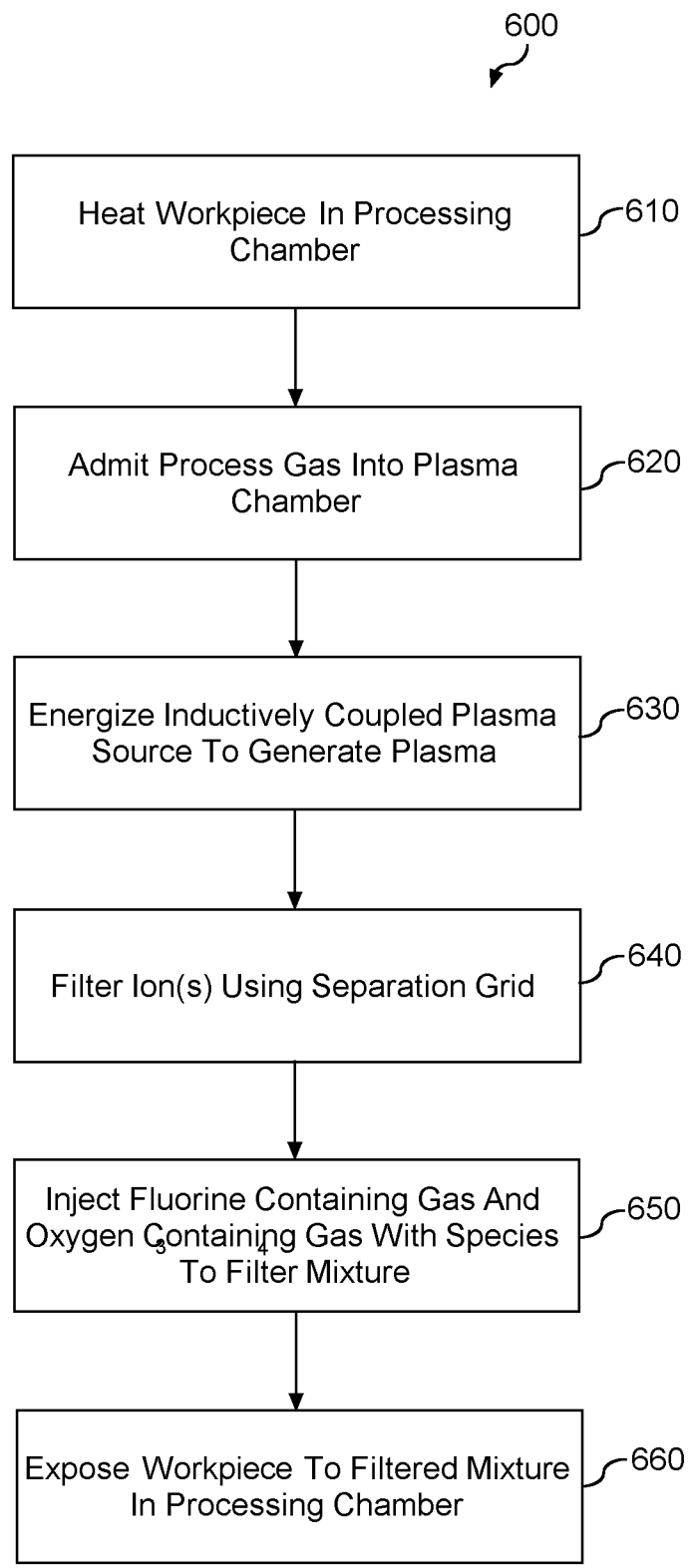
FIG. 6 depicts a flow diagram of an example method according to example embodiments of the present disclosure.

FIG. 6 depicts a flow diagram of an example method (600) according to example embodiments of the present disclosure. The method (600) will be discussed with reference to the plasma processing apparatus 100 of FIG. 4 by way of example. The method (600) can be implemented in any suitable plasma processing apparatus. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (610), the method can include heating a workpiece in a processing chamber. For instance, a workpiece 114 can include a silicon containing layer having one or more roughened portions. For instance, a FIN structure 50 includes a roughened surface 52. The workpiece 114 can be heated in a processing chamber 110 to a process temperature. The workpiece 114 can be heated, for instance, using one or more heating systems associated with a workpiece support 112. In some embodiments, the workpiece 114 can be heated to a process temperature in the range of about 100° C. to about 600° C., such as about 150° C. to about 300° C.

At (620), the method can include admitting a process gas into a plasma chamber. For instance, a process gas can be admitted into a plasma chamber interior 125 from a gas source 150 via annular gas distribution channel 151 or other suitable gas introduction mechanism. In some embodiments, the process gas can be an inert gas, such as helium, argon, etc. Other process gases can be used without deviating from the scope of the present disclosure.

At (630), the method can include energizing an inductively coupled plasma source to generate a plasma in a plasma chamber. For instance, an induction coil 130 can be energized with RF energy from RF power generator 134 to generate a plasma in the plasma chamber interior 125.

At (640), the method can include filtering one or more ions generated by the plasma using a separation grid to create a filtered mixture. The filtered mixture can include neutral species (e.g., excited inert gas molecules). In some embodiments, the one or more ions can be filtered using a separation grid assembly separating the plasma chamber from a processing chamber where the workpiece is located. For instance, the separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

At (650), the method can include injecting a fluorine containing gas and an oxygen containing gas into the filtered mixture to generate radicals for etching one or more roughened portions of the workpiece. For instance, the fluorine containing gas and the oxygen containing gas can be injected via a post-plasma gas injection system that can be located between the first grid plate 210 and the second grid plate 220 of the separation grid 200. The fluorine containing gas and/or the oxygen containing gas can be injected via a post-plasma gas injection system at a location beneath the separation grid. Example post plasma gas injection is illustrated in FIG. 7.

At (660), the method can include exposing the workpiece to the filtered mixture in the processing chamber. More particularly, the workpiece 114 can be exposed to radicals generated in the plasma and passing through the separation grid assembly 200. For instance, the workpiece 114 can be exposed to radicals generated using post plasma gas injection to etch one or more roughened portions of the workpiece to leave a smoother surface of the workpiece.

Figure 7:
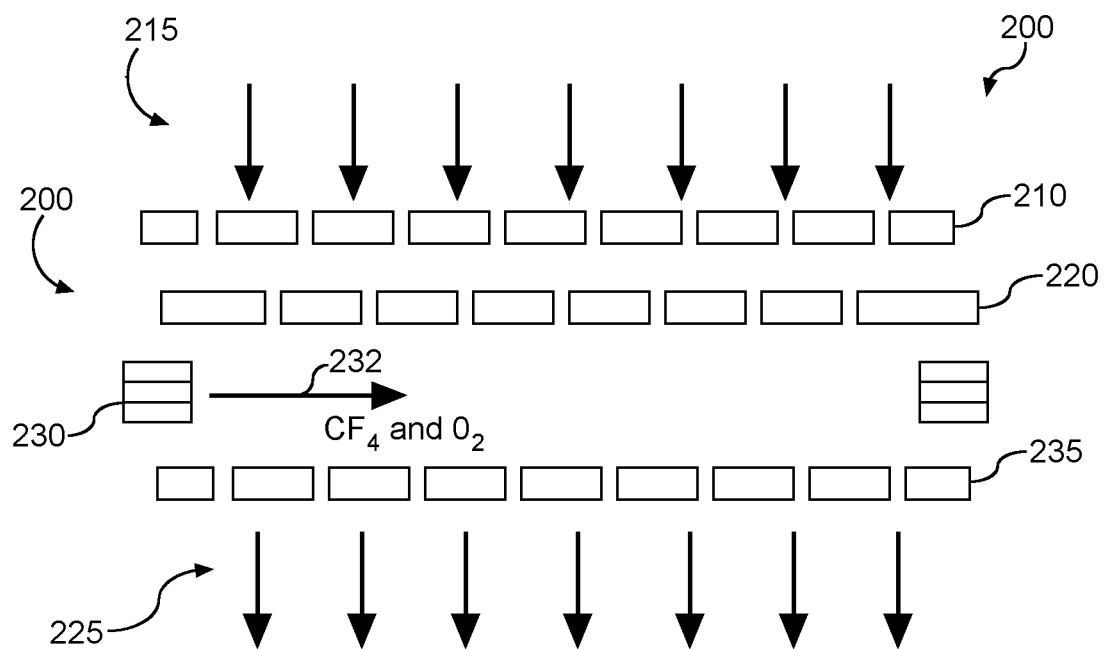
FIG. 7 depicts example introduction of fluorine containing gas and oxygen containing gas using post-plasma gas injection according to example embodiments of the present disclosure.

FIG. 7 depicts example introduction of fluorine containing gas and oxygen containing gas using post-plasma gas injection according to example embodiments of the present disclosure. The separation grid 200 includes a first grid plate 210 and a second grid plate 220 disposed in parallel relationship. The first grid plate 210 and the second grid plate 220 can provide for ion/UV filtering.

The first grid plate 210 can have a first grid pattern having a plurality of holes. The second grid plate 220 can have a second grid pattern having a plurality of holes. The first grid pattern can be the same as or different from the second grid pattern. Species 215 from the plasma can be exposed to the separation grid 200. Charged particles (e.g., ions) can recombine on the walls in their path through the holes of each grid plate 210, 220 in the separation grid 200. Neutral species can flow relatively freely through the holes in the first grid plate 210 and the second grid plate 220.

Subsequent to the second grid plate 220, a gas injection source 230 can be configured to introduce a fluorine containing gas and an oxygen containing gas into the species passing through the separation grid 200. A mixture 225 can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the fluorine containing gas and an oxygen containing gas can be mixed with the species at any point in the separation grid and/or after the separation grid in the processing chamber. For instance, the gas source 230 can be located between first grid plate 210 and second grid plate 220.

Figure 8:
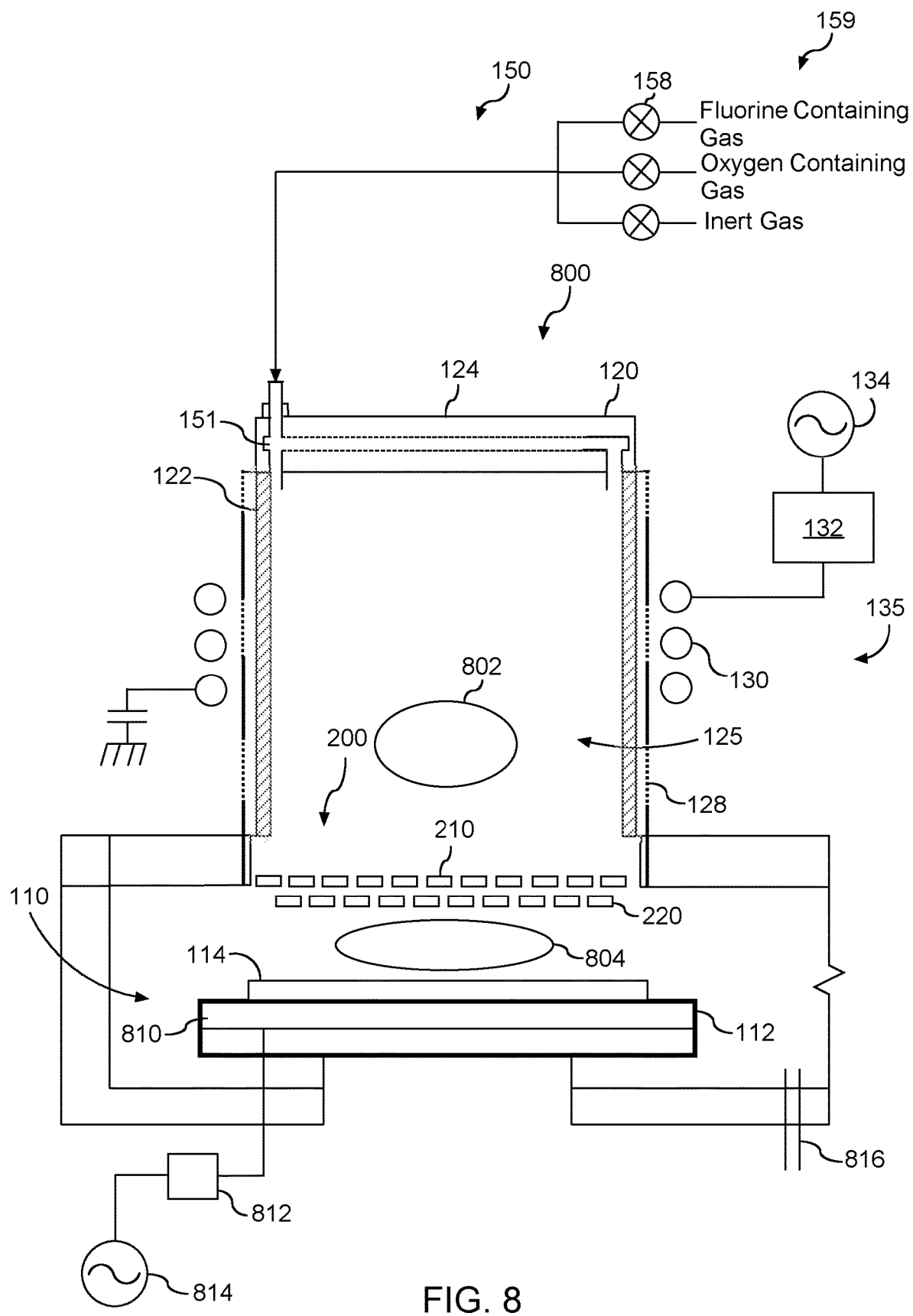
FIG. 8 depicts an example plasma processing apparatus according to example embodiments of the present disclosure.

FIG. 8 depicts an example plasma processing apparatus 800 according to example embodiments of the present disclosure. The plasma processing apparatus 800 is similar to the plasma processing apparatus 100 of FIG. 4.

More particularly, plasma processing apparatus 800 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 8, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 800 of FIG. 8 is operable to generate a first plasma 802 (e.g., a remote plasma) in the plasma chamber 120 and a second plasma 804 (e.g., a direct plasma) in the processing chamber 110. The first plasma 802 can be generated by an inductively coupled plasma source. The second plasma 804 can be generated by, for instance, a capacitively coupled plasma source (e.g., bias). As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 800 of FIG. 8 includes a bias source having bias electrode 810 in the pedestal 112. The bias electrode 810 can be coupled to an RF power generator 814 via a suitable matching network 812. When the bias electrode 810 is energized with RF energy, a second plasma 804 can be generated from a mixture in the processing chamber 110 for direct exposure to the workpiece 114. The processing chamber 110 can include a gas exhaust port 816 for evacuating a gas from the processing chamber 110.

As shown in FIG. 8, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 4, the gas delivery system 150 can include feed gas line(s) for delivery of a fluorine containing gas (e.g., tetrafluoromethane ($CF_4$), nitrogen trifluoride ($NF_3$), or a gas with a formula $CF_xH_y$, wherein x and y are positive integers), feed gas line(s) for delivery of an oxygen containing gas (e.g., oxygen ($O_2$), water vapor ($H_2O$), or nitrous oxide ($NO_2$)), and feed gas line(s) for delivery of an inert gas (e.g., helium (He), argon (Ar), xenon (Xe), neon (Ne), or nitrogen ($N_2$)). A control valve and/or mass flow controller 158 can be used to control a flow rate of each feed gas line to flow a process gas into the plasma chamber 120.

Figure 9:
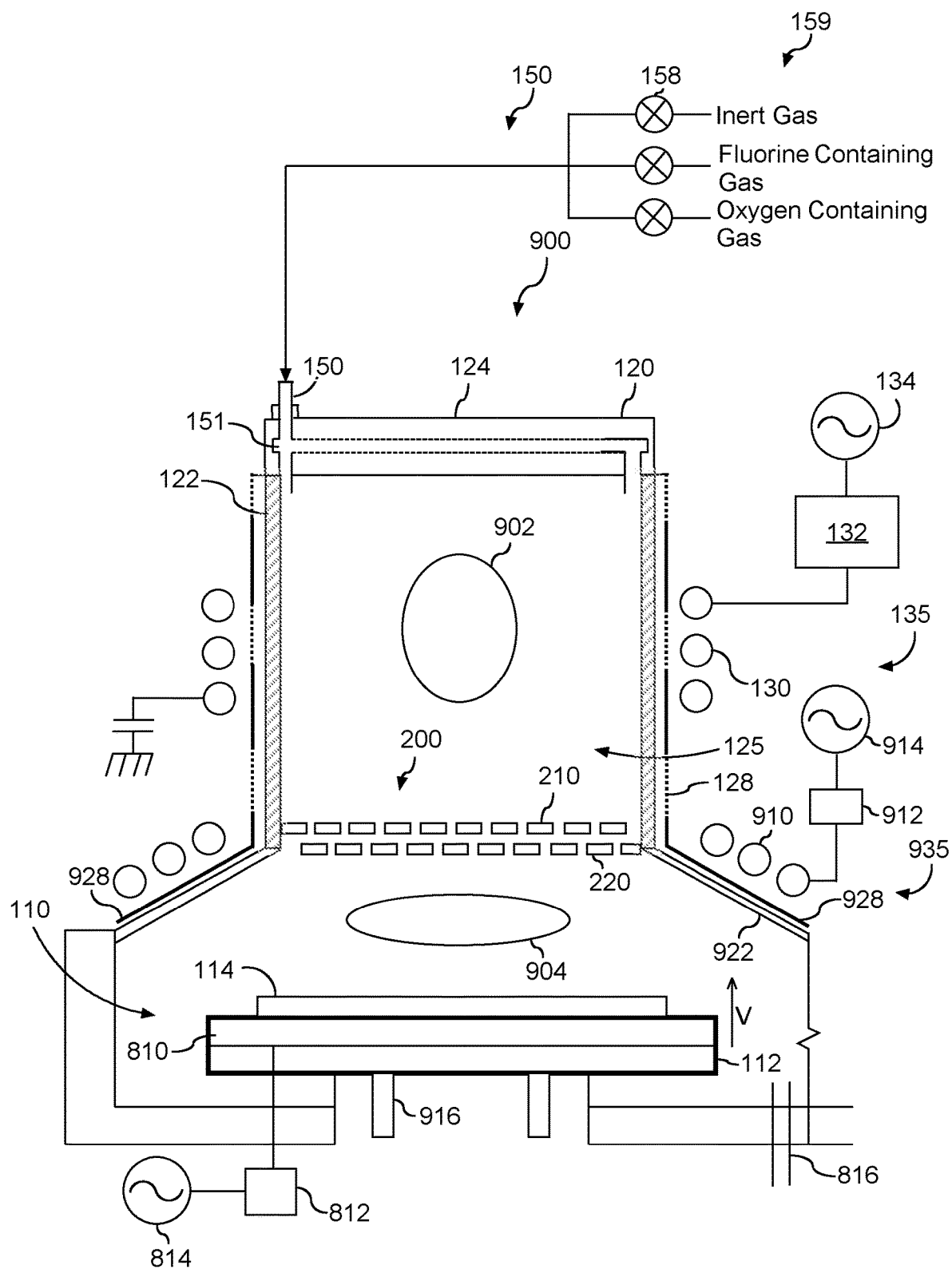
FIG. 9 depicts an example plasma processing apparatus according to example embodiments of the present disclosure.

FIG. 9 depicts an example plasma processing apparatus 900 according to example embodiments of the present disclosure. The plasma processing apparatus 900 is similar to the plasma processing apparatus 100 of FIG. 4, and the plasma processing apparatus 800 of FIG. 8.

More particularly, plasma processing apparatus 900 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 9, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 900 of FIG. 9 is operable to generate a first plasma 902 (e.g., a remote plasma) in the plasma chamber 120 and a second plasma 904 (e.g., a direct plasma) in the processing chamber 110. As shown, the plasma processing apparatus 900 can include an angled dielectric sidewall 922 that extends from the vertical sidewall 122 associated with the remote plasma chamber 120. The angled dielectric sidewall 922 can form a part of the processing chamber 110.

A second inductive plasma source 935 can be located proximate the dielectric sidewall 922. The second inductive plasma source 935 can include an induction coil 910 coupled to an RF generator 914 via a suitable matching network 912. The induction coil 910, when energized with RF energy, can induce a direct plasma 904 from a mixture in the processing chamber 110. A Faraday shield 928 can be disposed between the induction coil 910 and the sidewall 922.

The pedestal 112 can be movable in a vertical direction noted as "V." For instance, the pedestal 112 can include a vertical lift 916 that can be configured to adjust a distance between the pedestal 112 and the separation grid assembly 200. As one example, the pedestal 112 can be located in a first vertical position for processing using the remote plasma 902. The pedestal 112 can be in a second vertical position for processing using the direct plasma 904. The first vertical position can be closer to the separation grid assembly 200 relative to the second vertical position.

The plasma processing apparatus 900 of FIG. 9 includes a bias source having bias electrode 810 in the pedestal 112. The bias electrode 810 can be coupled to an RF power generator 814 via a suitable matching network 812. The processing chamber 110 can include a gas exhaust port 816 for evacuating a gas from the processing chamber 110.

As shown in FIG. 9, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 4, the gas delivery system 150 can include feed gas line(s) for delivery of a fluorine containing gas (e.g., tetrafluoromethane ($CF_4$), nitrogen trifluoride ($NF_3$), or a gas with a formula $CF_xH_y$, wherein x and y are positive integers), feed gas line(s) for delivery of an oxygen containing gas (e.g., oxygen ($O_2$), water vapor ($H_2O$), or nitrous oxide ($NO_2$)), and feed gas line(s) for delivery of an inert gas (e.g., helium (He), argon (Ar), xenon (Xe), neon (Ne), or nitrogen ($N_2$)). A control valve and/or mass flow controller 158 can be used to control a flow rate of each feed gas line to flow a process gas into the plasma chamber 120.

Figure 10:
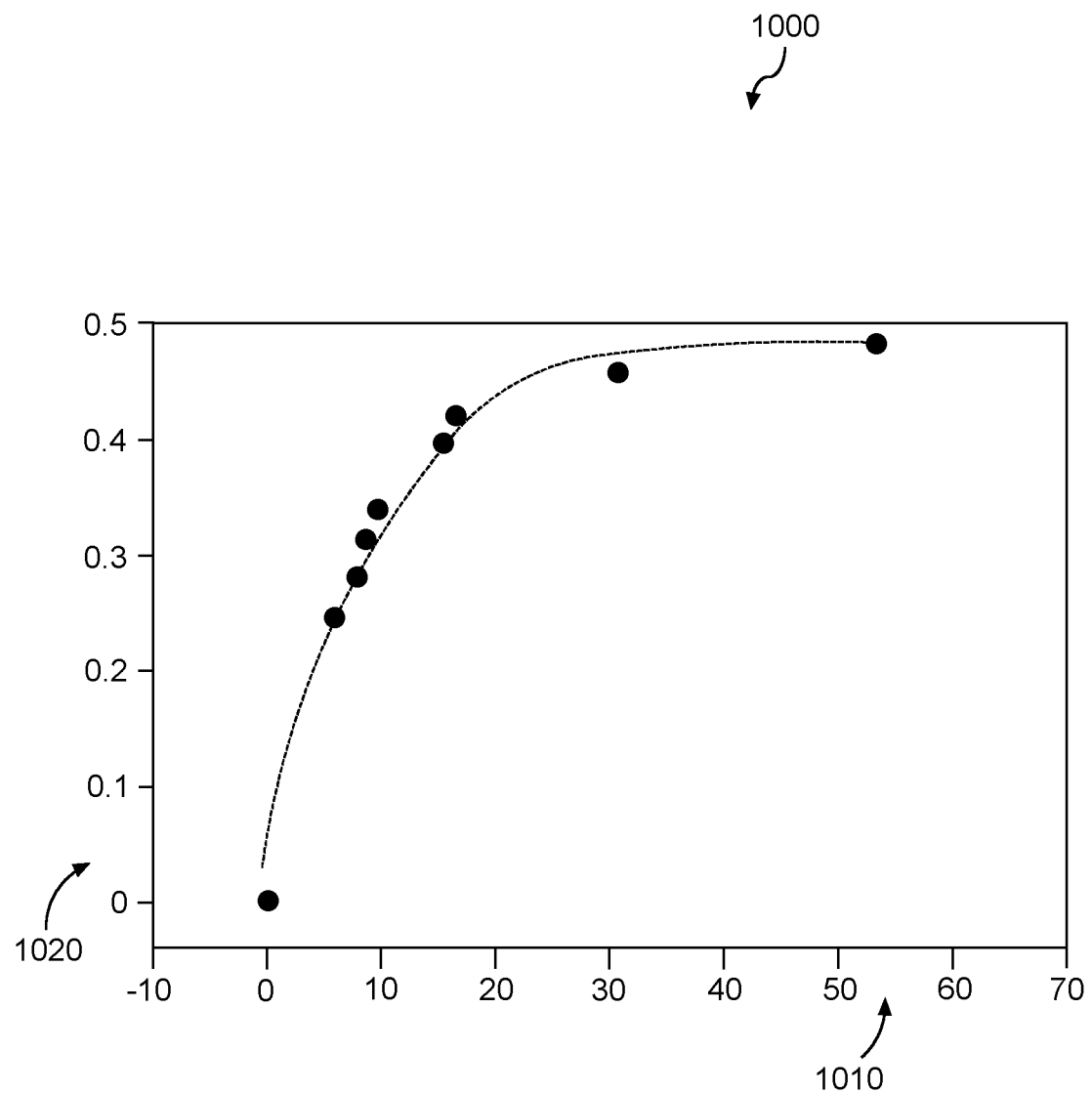
FIG. 10 depicts an example surface roughness improvement as a function of etch amount.

FIG. 10 depicts an example 1000 surface roughness improvement 1020 as a function of etch amount 1010. As can be seen in FIG. 10, there is a correlation between the roughness improvement 1020 and the etch amount 1010. As the etch amount 1010 increases, the roughness improvement

1020 proportionally increases with the etch amount 1010 until the roughness improvement 1020 reaches a plateau (e.g., the etch amount 1010 is in a range of about 30 to about 60).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a silicon containing layer, wherein a surface of the silicon containing layer comprises a roughened portion, the method comprising:
   generating species from a process gas by generating a plasma using an inductive coupling element in a first chamber;
   providing a fluorine-containing gas and an oxygen-containing gas into the species to generate a mixture;
   exposing the surface of the silicon containing layer to the mixture such that the mixture at least partially etches the roughened portion to leave a smoother surface of the silicon containing layer,
   wherein the workpiece is in a second chamber that is separated from the first chamber by a separation grid,
   wherein the fluorine-containing gas and the oxygen-containing gas are introduced into the species generated by the plasma passing through the separation grid via a post-plasma gas injection source located between a first grid plate and a second grid plate of the separation grid, wherein each of the first grid plate and the second grid plate provide ion filtering, the fluorine-containing gas and the oxygen-containing gas being mixed with the species between the first grid plate and the second grid plate to generate the mixture for exposure to the workpiece.

2. The method of claim 1, wherein the roughened portion comprises a concave area and a convex area, wherein the concave area is thicker than the convex area, wherein the mixture at least partially etches the concave area more than the convex area to leave the smoother surface of the silicon containing layer.

3. The method of claim 1, wherein the mixture at least partially oxidizes and at least partially etches the roughened portion simultaneously to leave the smoother surface.

4. The method of claim 1, wherein the process gas comprises an inert gas.

5. The method of claim 1, wherein the silicon containing layer comprises crystalline silicon, polysilicon, or silicon germanium.

6. The method of claim 1, wherein the fluorine-containing gas comprises tetrafluoromethane ($CF_4$), nitrogen trifluoride ($NF_3$), or a gas with a formula $CF_xH_y$, wherein x and y are positive integers.

7. The method of claim 1, wherein the oxygen-containing gas comprises oxygen ($O_2$), water vapor ($H_2O$), or nitrous oxide ($NO_2$).

8. The method of claim 1, wherein an oxidation layer is formed on the smoother surface of the silicon containing layer.

9. The method of claim 8, further comprising a wet process to at least partially remove the oxidation layer.

10. The method of claim 1, wherein the smoother surface comprises a material with a formula $SiO_xF_yC_z$, wherein x, y and z are positive integers.

11. The method of claim 10, wherein the smoother surface is formed via a deposition process based at least in part on a reaction between the at least partially roughened portion and the mixture.

* * * * *